(12) United States Patent
Ho et al.

(10) Patent No.: US 9,899,265 B2
(45) Date of Patent: Feb. 20, 2018

(54) GATE STRUCTURES WITH VARIOUS WIDTHS AND METHOD FOR FORMING THE SAME

(71) Applicant: Taiwan Semiconductor Manufacturing Co., Ltd., Hsin-Chu (TW)

(72) Inventors: Wei-Shuo Ho, New Taipei (TW); Tsung-Yu Chiang, New Taipei (TW); Chia-Ming Chang, Hsinchu (TW); Jyun-Ming Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/383,837

(22) Filed: Dec. 19, 2016

(65) Prior Publication Data

US 2017/0098581 A1     Apr. 6, 2017

Related U.S. Application Data

(62) Division of application No. 14/178,906, filed on Feb. 12, 2014, now Pat. No. 9,524,965.

(51) Int. Cl.
*H01L 21/8234* (2006.01)
*H01L 27/088* (2006.01)
(Continued)

(52) U.S. Cl.
CPC .. *H01L 21/823456* (2013.01); *H01L 21/0273* (2013.01); *H01L 21/283* (2013.01);
(Continued)

(58) Field of Classification Search
CPC ......... H01L 21/76877; H01L 21/31051; H01L 21/0273; H01L 21/31144; H01L 21/32133;
(Continued)

(56) References Cited

U.S. PATENT DOCUMENTS 8,614,131 B2   12/2013  Tu
8,685,850 B2   4/2014   Zhang et al.
(Continued)

FOREIGN PATENT DOCUMENTS

CN      102640291 A      8/2012
KR   10-2013-0140231    12/2012
(Continued)

*Primary Examiner* — Benjamin Sandvik
*Assistant Examiner* — Farid Khan
(74) *Attorney, Agent, or Firm* — Haynes and Boone, LLP (57) ABSTRACT

Embodiments of a semiconductor device structure and a method for forming the same are provided. The semiconductor device structure includes a substrate and a first metal gate structure formed over the substrate. The first metal gate structure has a first width. The semiconductor device structure further includes a first contact formed adjacent to the first metal gate structure and a second metal gate structure formed over the substrate. The second metal gate structure has a second width smaller than the first width. The semiconductor device structure further includes an insulating layer formed over the second metal gate structure and a second contact self-aligned to the second metal gate structure.

20 Claims, 9 Drawing Sheets

(51) Int. Cl.
  *H01L 21/28*    (2006.01)
  *H01L 21/283*   (2006.01)
  *H01L 29/66*    (2006.01)
  *H01L 29/49*    (2006.01)
  *H01L 21/768*   (2006.01)
  *H01L 21/027*   (2006.01)
  *H01L 21/3105*  (2006.01)
  *H01L 21/311*   (2006.01)
  *H01L 21/3213*  (2006.01)
  *H01L 29/51*    (2006.01)

(52) U.S. Cl.
  CPC .. *H01L 21/28008* (2013.01); *H01L 21/28123* (2013.01); *H01L 21/31051* (2013.01); *H01L 21/31144* (2013.01); *H01L 21/32133* (2013.01); *H01L 21/32139* (2013.01); *H01L 21/76802* (2013.01); *H01L 21/76877* (2013.01); *H01L 21/76897* (2013.01); *H01L 21/823475* (2013.01); *H01L 27/088* (2013.01); *H01L 29/4966* (2013.01); *H01L 29/6656* (2013.01); *H01L 29/66545* (2013.01); *H01L 21/76834* (2013.01); *H01L 29/51* (2013.01); *H01L 29/6659* (2013.01)

(58) Field of Classification Search
  CPC ......... H01L 21/32139; H01L 21/76802; H01L 21/76897; H01L 29/6656; H01L 29/66545
  See application file for complete search history.

(56) References Cited

U.S. PATENT DOCUMENTS

| | | | |
|---|---|---|---|
| 8,896,030 B2 | 11/2014 | Mukherjee | |
| 8,937,359 B2 | 1/2015 | Xie et al. | |
| 9,130,023 B2* | 9/2015 | Yamasaki | H01L 21/823842 |
| 9,214,349 B2* | 12/2015 | Kim | H01L 21/76801 |
| 9,324,577 B2 | 4/2016 | Chiang | |
| 9,349,812 B2 | 5/2016 | Chen et al. | |
| 9,508,821 B2 | 11/2016 | Bohr et al. | |
| 2007/0096212 A1* | 5/2007 | Sato | H01L 21/76895 257/350 |
| 2010/0197141 A1* | 8/2010 | Tu | H01L 21/76895 438/702 |
| 2013/0181265 A1* | 7/2013 | Grasshoff | H01L 21/76897 257/288 |
| 2013/0187236 A1* | 7/2013 | Xie | H01L 29/4966 257/369 |
| 2014/0070320 A1* | 3/2014 | Mukherjee | H01L 21/823456 257/368 |
| 2014/0227843 A1 | 8/2014 | Tsukamoto et al. | |
| 2014/0346575 A1* | 11/2014 | Chen | H01L 21/76897 257/288 |
| 2014/0361352 A1 | 12/2014 | Hung et al. | |
| 2016/0056263 A1 | 2/2016 | Grasshoff | |

FOREIGN PATENT DOCUMENTS

| | | |
|---|---|---|
| TW | 200725750 A | 7/2007 |
| TW | 201131771 A1 | 9/2011 |
| TW | 201225163 A1 | 6/2012 |
| WO | WO-2011/090571 | 7/2011 |

* cited by examiner

GATE STRUCTURES WITH VARIOUS WIDTHS AND METHOD FOR FORMING THE SAME

PRIORITY DATA

The present application is a divisional application of U.S. patent application Ser. No. 14/178,906, filed Feb. 12, 2014, entitled "GATE STRUCTURES WITH VARIOUS WIDTHS AND METHOD FOR FORMING THE SAME," issued as U.S. Pat. No. 9,524,965, which is hereby incorporated by reference in its entirety.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

One of the important drivers for increased performance in computers is the higher levels of integration of circuits. This is accomplished by miniaturizing or shrinking device sizes on a given chip. Tolerances play an important role in being able to shrink dimensions on a chip.

As technology nodes shrink, in some integrated circuit (IC) designs, there has been a desire to replace the typically polysilicon gate with a metal gate to improve device performance with the decreased feature sizes. One process of forming the metal gate is termed the "gate last" process. In a "gate last" process, the final metal gate is fabricated last which allows for a reduced number of subsequent processes.

However, although existing "gate last" processes have been generally adequate for their intended purposes, as device scaling-down continues, they have not been entirely satisfactory in all respects.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

Some variations of the embodiments are described. Throughout the various views and illustrative embodiments, like reference numbers are used to designate like elements.

Embodiments of a semiconductor device structure are provided in accordance with some embodiments of the disclosure. The semiconductor device structure may include a number of gate structures having various channel lengths (e.g. various gate widths). Generally, gate structures having relatively small channel lengths also tend to have small pitch. However, when the pitch is too small, risks of shortage between the gate structure and the contact formed adjacent to the gate structure increase. Therefore, the gate structures are shortened and an insulating layer is formed over the shortened gate structures to prevent the shortage between the gate structures and the contact. In addition, the contact can be self-aligned to the gate structure.

Figure 1:
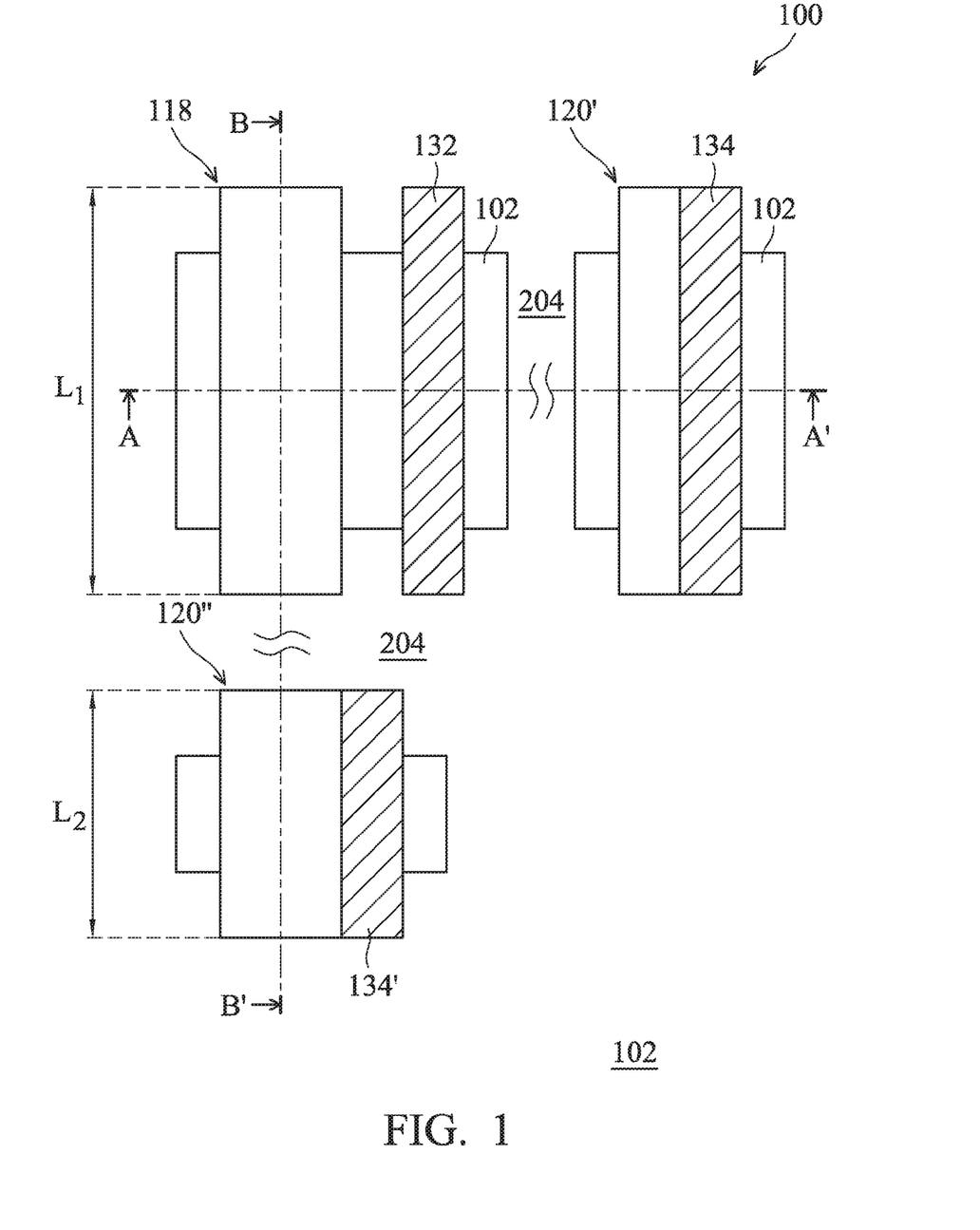
FIG. 1 illustrates a top view representation of a semiconductor device structure in accordance with some embodiments.

FIG. 1 illustrates a top view representation of a semiconductor device structure 100 in accordance with some embodiments. Semiconductor device structure 100 includes a wide metal gate structure 118 and a shortened narrow metal gate structure 120' formed over a substrate 102. The width of wide metal gate structure 118 is greater than the width of shortened narrow metal gate structure 120'. In addition, the height of wide metal gate structure 118 is greater than the height of shortened narrow metal gate structure 120'.

In addition, a first contact 132 is formed adjacent to wide metal gate structure 118, and a second contact 134 is adjacent to shortened narrow metal gate structure 120'. In some embodiments, wide metal gate structure 118, shortened narrow metal gate structure 120', first contact 132, and second contact 134 are formed over substrate 102, and shallow trench isolation (STI) regions 204 are formed in substrate 102.

FIGS. 2A to 2K illustrate cross-section representations of various stages of forming semiconductor device structure 100 shown along line A-A' illustrated in FIG. 1 in accordance with some embodiments.

Figure 2A:
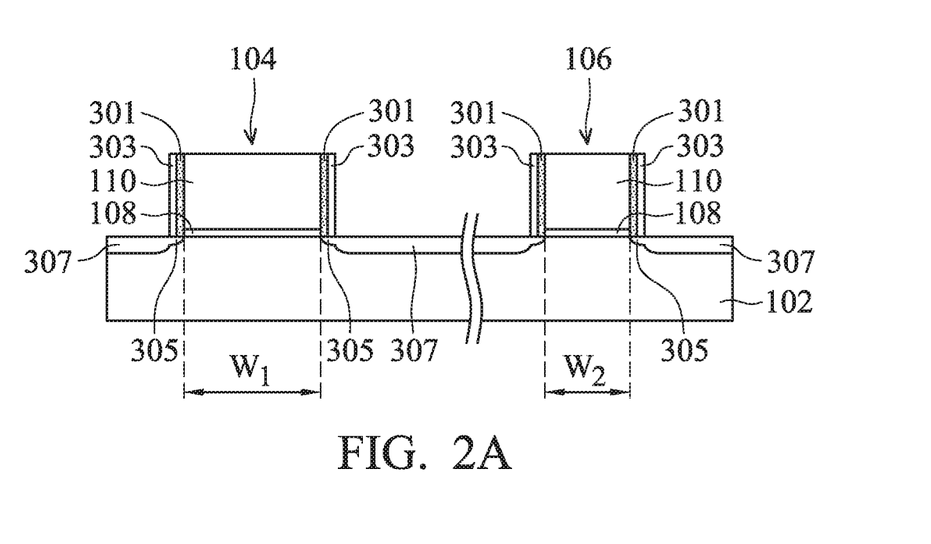
FIGS. 2A to 2K illustrate cross-section representations of various stages of forming the semiconductor device structure shown along line A-A' illustrated in FIG. 1 in accordance with some embodiments.

As shown in FIG. 2A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In some embodiments, substrate 102 includes structures such as doped regions, isolation features, interlayer dielectric (ILD) layers, and/or conductive features. In addition, substrate 102 may further include single or multiple material layers to be patterned. For example, the material layers may include a silicon layer, a dielectric layer, and/or a doped poly-silicon layer.

A wide dummy gate structure 104 and a narrow dummy gate structure 106 are formed over substrate 102, as shown in FIG. 2A in accordance with some embodiments. In some embodiments, wide dummy gate structure 104 has a first width $W_1$, and narrow dummy gate structure 106 has a second width $W_2$ smaller than first width $W_1$. In some embodiments, first width $W_1$ of wide dummy gate substrate 104 is in a range from about 10 nm to about 500 nm. In some embodiments, second width $W_2$ of narrow dummy gate structure 106 is in a range from about 5 nm to about 250 nm. In some embodiments, the ratio of first width $W_1$ to second width $W_2$ is in a range from about 2 to about 15.

In some embodiments, wide dummy gate structure 104 and narrow dummy gate structure 106 respectively include a dummy gate dielectric layer 108 and a dummy gate electrode layer 110. In some embodiments, dummy gate dielectric layer 108 is made of high-k dielectric materials, such as metal oxides, metal nitrides, metal silicates, transition metal-oxides, transition metal-nitrides, transition metal-silicates, or oxynitrides of metals. Examples of the high-k dielectric material include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), silicon nitride, silicon oxynitride, zirconium oxide, titanium oxide, aluminum oxide, hafnium dioxide-alumina ($HfO_2$—$Al_2O_3$) alloy, or other applicable dielectric materials. In some embodiments, dummy gate electrode layer 110 is made of polysilicon.

Wide dummy gate structure 104 and narrow dummy gate structure 106 may be formed by a procedure including deposition, photolithography patterning, and etching processes. The deposition processes may include chemical vapor deposition (CVD), physical vapor deposition (PVD), atomic layer deposition (ALD), high density plasma CVD (HDPCVD), metal organic CVD (MOCVD), or plasma enhanced CVD (PECVD). The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching).

It should be noted that wide dummy gate structure 104 and narrow dummy gate structure 106 may be adjacent to each other or other structures may be formed between wide dummy gate structure 104 and narrow dummy gate structure 106, and the scope of the disclosure is not intended to be limiting.

In some embodiments, a sealing layer 301 is formed on the sidewalls of wide dummy gate substrate 104 and narrow dummy gate structure 106. Sealing layer 108 may protect wide dummy gate substrate 104 and narrow dummy gate structure 106 from damage or loss during subsequent processing and may also prevent oxidation during subsequent processing. In some embodiments, sealing layer 301 is made of silicon nitride, silicon oxide, silicon oxynitride, silicon carbide, or other applicable dielectric materials. Sealing layer 301 may include a single layer or multiple layers.

Spacers 303 are further formed on sealing layer 301 in accordance with some embodiments. In some embodiments, spacers 303 are made of silicon nitride, silicon oxide, silicon carbide, silicon oxynitride, or other applicable materials. Spacers 303 may be formed by deposition and etching processes.

In addition, various doped regions may also be formed in substrate 102. In some embodiments, lightly doped source/drain (LDD) regions 305 and source/drain (S/D) regions 307 are formed in substrate 102, as shown in FIG. 2A in accordance with some embodiments. LDD regions 305 and S/D regions 307 may be formed by ion implantation processes, photolithography, diffusion, and/or other applicable processes. In some embodiments, LDD regions 305 and S/D regions 307 are doped with p-type dopants, such as boron or $BF_2$, and/or n-type dopants, such as phosphorus or arsenic.

Figure 2B:
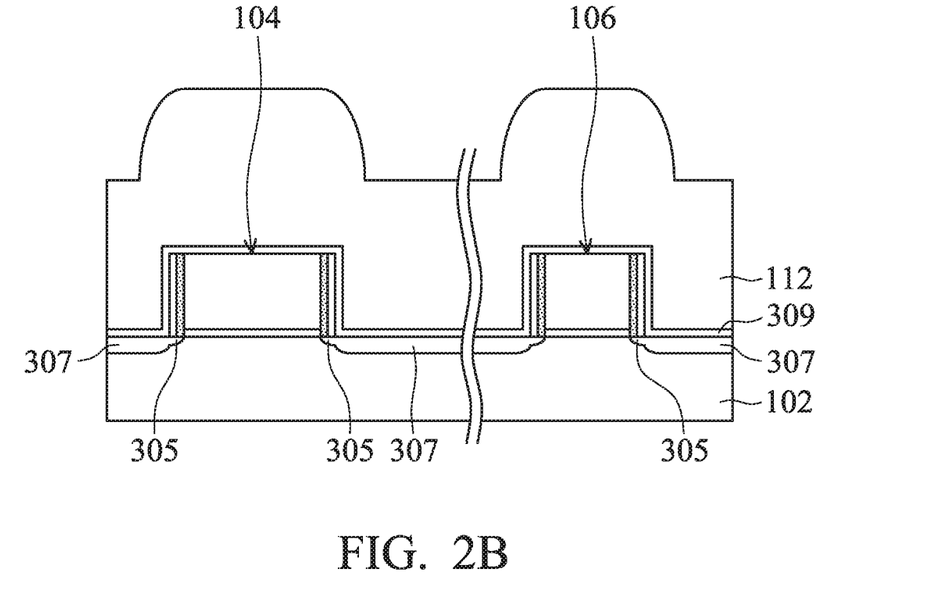

After wide dummy gate structure 104 and narrow dummy gate structure 106 are formed, a contact etch stop layer (CESL) 309 is formed to cover wide dummy gate structure 104 and narrow dummy gate structure 106 over substrate 102, as shown in FIG. 2B in accordance with some embodiments. In some embodiments, CESL 309 is made of silicon nitride, silicon oxynitride, and/or other applicable materials. CESL 309 may be formed by plasma enhanced CVD, low pressure CVD, ALD, or other applicable processes.

After CESL 309 is formed, an ILD layer 112 is formed on CESL 309 over substrate 102 in accordance with some embodiments. ILD layer 112 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. ILD layer 112 may be formed by chemical vapor deposition (CVD), physical vapor deposition, (PVD), atomic layer deposition (ALD), spin-on coating, or other applicable processes.

Figure 2C:
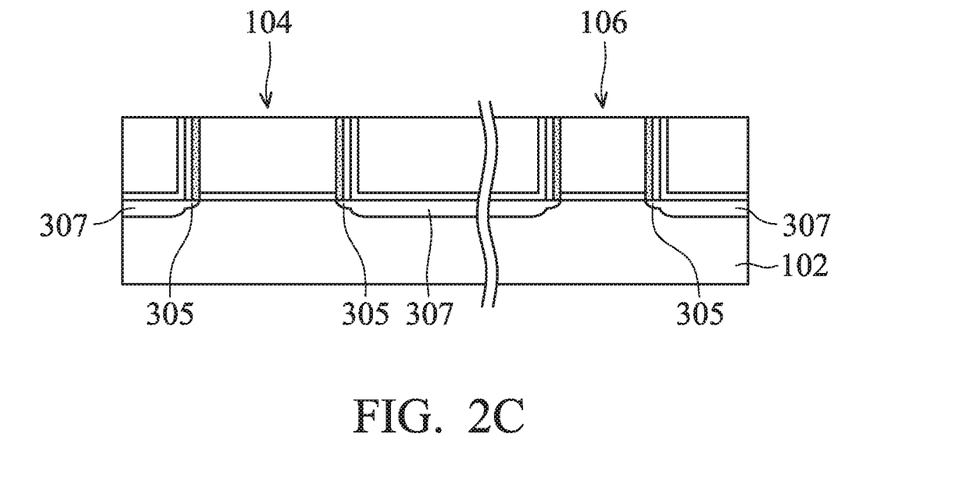

Afterwards, a polishing process is performed to ILD layer 112, as shown in FIG. 2C in accordance with some embodiments. In some embodiments, ILD layer 112 is planarized by a chemical mechanical polishing (CMP) process until the top surfaces of wide dummy gate structure 104 and narrow dummy gate structure 106 are exposed.

Figure 2D:
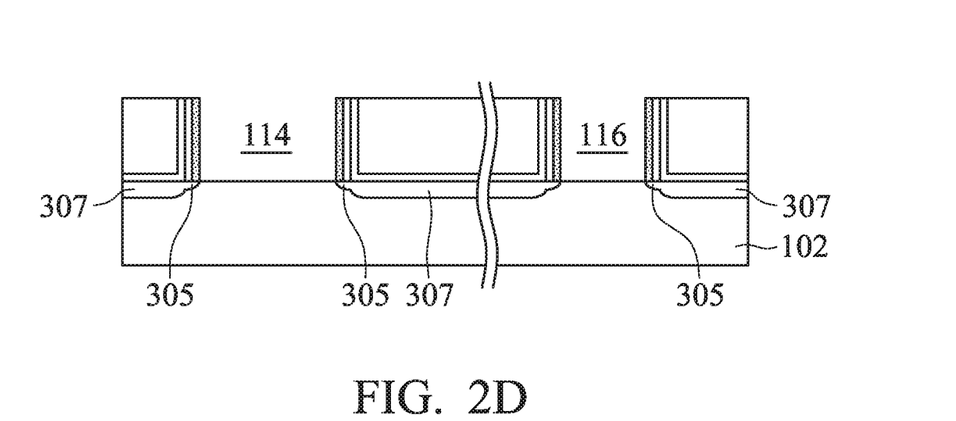
Figure 2E:
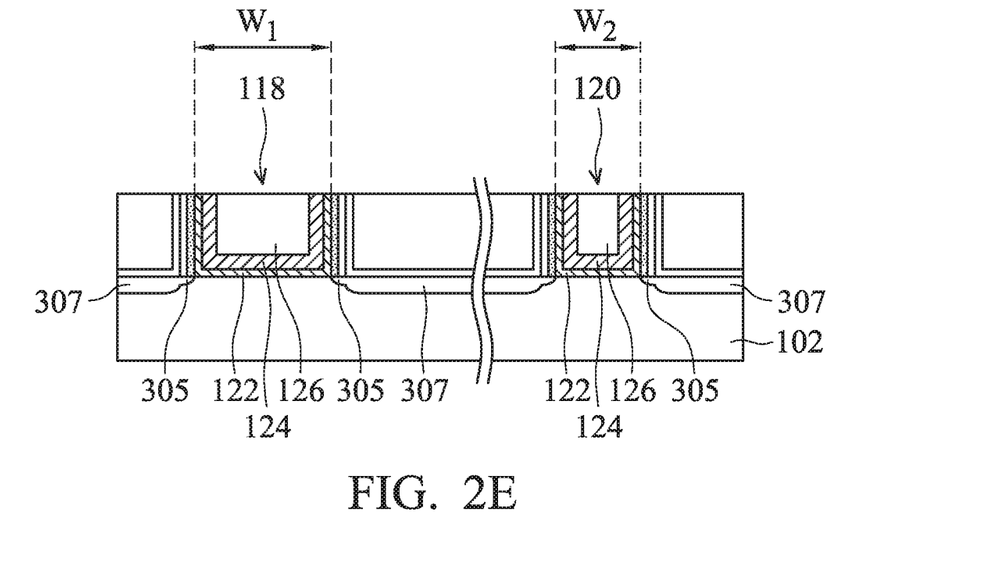

After the polishing process is performed, wide dummy gate structure 104 is replaced by wide metal gate structure 118, and narrow dummy gate structure 106 is replaced by a narrow metal gate structure 120. More specifically, wide dummy gate structure 104 and narrow dummy gate structure 106 are removed to form a wide trench 114 and a narrow trench 116, as shown in FIG. 2D in accordance with some embodiments. In some embodiments, dummy gate electrode layer 110 is removed by a first etching process, and dummy gate dielectric layer 108 is removed by a second etching process after the first etching process is performed. Afterwards, wide metal gate structure 118 and narrow metal gate structure 120 are respectively formed in wide trench 118 and narrow trench 120, as shown in FIG. 2E in accordance with some embodiments.

In some embodiments, wide metal gate structure 118 and narrow metal gate structure 120 respectively include a gate dielectric layer 122, a work function metal layer 124, and a metal gate electrode layer 126.

In some embodiments, gate dielectric layer 122 is made of high k dielectric materials. Examples of the high k dielectric material may include, but are not limited to, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

Work function metal layer 124 is formed over gate dielectric layer 122. Work function metal layer 124 is tuned to have a proper work function. For example, if a P-type work function metal (P-metal) for a PMOS device is desired, TiN, WN, or W may be used. On the other hand, if an N-type work function metal (N-metal) for NMOS devices is desired, TiAl, TiAlN, or TaCN, may be used.

Metal gate electrode layer 126 is formed over work function metal layer 124. In some embodiments, metal gate electrode layer 126 is made of a conductive material, such as aluminum, copper, tungsten, titanium, tantulum, titanium nitride, tantalum nitride, nickel silicide, cobalt silicide, TaC, TaSiN, TaCN, TiAl, TiAlN, or other applicable materials. Gate dielectric layer 122, work function metal layer 124, and metal gate electrode layer 126 may be formed by any applicable process to any applicable thickness.

It should be noted that additional layers may be formed above and/or below gate dielectric layer 122, work function metal layer 124, and metal gate electrode layer 126, such as liner layers, interface layers, seed layers, adhesion layers, barrier layers, or the like. In addition, gate dielectric layer 122, work function metal layer 124, and metal gate electrode layer 126 may include one or more materials and/or one or more layers.

As shown in FIG. 2E, wide metal gate structure 118 is formed in wide trench 114 and has first width $W_1$. Narrow metal gate structure 120 is formed in narrow trench 116 and has second width $W_2$ smaller than first width $W_1$. However, when second width $W_2$ of narrow metal gate structure 120 is too small, it may be difficult to align and form second contact 134 without shortage between narrow metal gate structure 120 and second contact 134. Therefore, narrow metal gate structure 120 is shortened by an etching back process to form shortened narrow metal gate structure 120', such that an insulating layer 128 can be formed on shortened narrow metal gate structure 120' to prevent shortage between second contact 134 and shortened narrow metal gate structure 120'.

In addition, during the etching back process, wide metal gate structure 118 may also be etched. However, if wide metal gate structure 118 and narrow metal gate structure 120 are both etched by the etching back process, the amount of the top portion of wide metal gate structure 118 removed by the etching back process will be greater than the amount of the top portion of narrow metal gate structure 120 removed by the etching back process due to the loading effect. That is, too much wide metal gate structure 118, such as the top portion of work function metal layer 124 and metal gate electrode layer 126 of wide metal gate structure 118, may be removed by the etching back process. Therefore, shortened wide metal gate structure may be damaged, and the threshold voltage of the structure may be changed. Accordingly, a mask structure 311 is used to prevent wide metal gate structure 118 from being damaged by the etching back process, as shown in FIG. 2F in accordance with some embodiments.

Figure 2F:
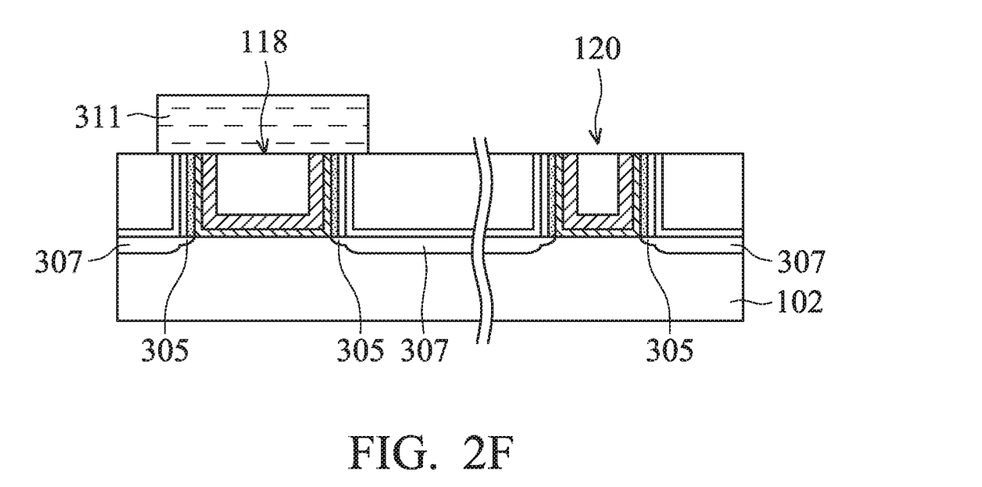

As shown in FIG. 2F, mask structure 311 is formed over wide metal gate structure 118 to protect wide metal gate structure 118 from the sequential etching process in accordance with some embodiments. As shown in FIG. 2F, mask structure 311 covers wide metal gate structure 118 but does not cover narrow metal gate structure 120. Therefore, wide metal gate structure 118 is protected by mask structure 311 during the subsequent etching back process while the top surface of narrow metal gate structure 120 is exposed. In some embodiments, mask structure 311 includes a photoresist layer and a bottom anti-reflective coating (BARC) layer.

Figure 2G:
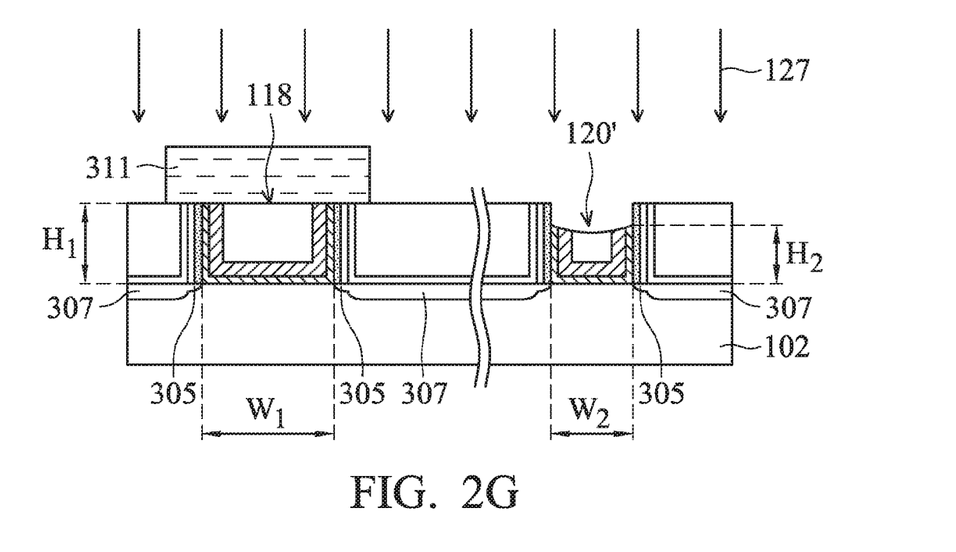

After mask structure 311 is formed, an etching back process 127 is performed to shorten narrow metal gate structure 120, as shown in FIG. 2G in accordance with some embodiments. Since wide metal gate structure 118 is protected by mask structure 311, the height of wide metal gate structure 118 remains after etching back process 127 is performed. However, the top surface of narrow metal gate structure 120 is exposed during etching back process 127, and therefore narrow metal gate structure 120 is shortened to form shortened narrow metal gate structure 120' after etching back process 127 is performed.

In some embodiments, wide metal gate structure 118 has a first height $H_1$, and shortened narrow metal gate structure 120' has a second height $H_2$ less than first height $H_1$. In some embodiments, first height $H_1$ is in a range from about 400 A to about 1000 A. In some embodiments, second height $H_2$ is in a range from 100 A to about 990 A. In some embodiments, the ratio of first height $H_1$ to second height $H_2$ is in a range from about 4 to about 10.

In addition, since wide metal gate structure 118 is formed by replacing wide dummy gate structure 104 and shortened narrow metal gate structure 120' is formed by replacing narrow dummy gate structure 106, wide metal gate structure 118 also has first width $W_1$ and shortened narrow metal gate structure 120' has second width $W_2$ smaller than first width $W_1$. In some embodiments, the ratio of first height $H_1$ to first width $W_1$ is in a range from about 25 to about 1. In some embodiments, the ratio of second height $H_2$ to second width $W_2$ is in a range from about 1 to about 30.

Figure 2H:
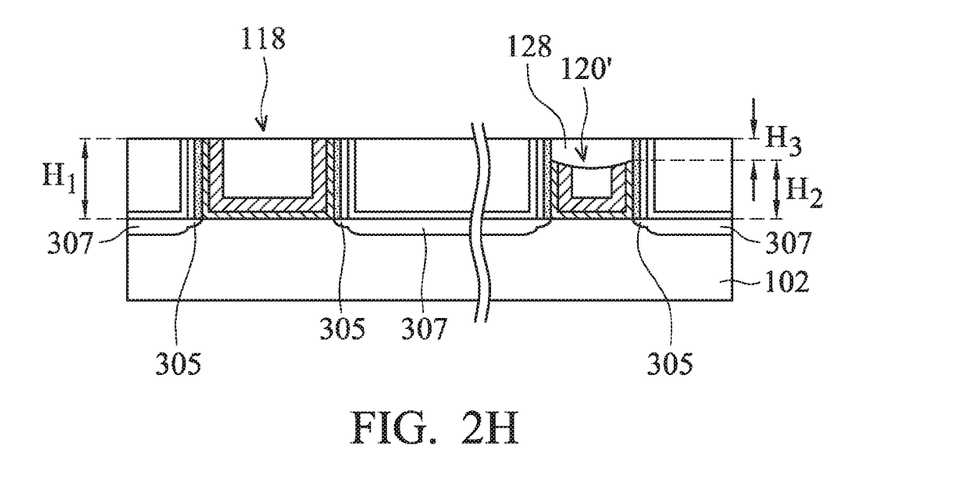

After etching back process 127 is performed, mask structure 311 is removed, and insulating layer 128 is formed on shortened narrow metal gate structure 120' in accordance with some embodiments. As shown in FIG. 2H, insulating layer 128 is formed on shortened narrow metal gate structure 120' but not on wide metal gate structure 118. In some embodiments, insulating layer 128 is formed by depositing an insulating material over substrate 102 and removing the top portion of the insulating material to expose the top surface of wide metal gate structure 118.

In some embodiments, insulating layer 128 has a third height $H_3$. In some embodiments, third height $H_3$ is in a range from about 1 A to about 300 A. In some embodiments, first height $H_1$ of wide metal gate structure 118 is substantially equal to the sum of second height $H_2$ of shortened narrow metal gate structure 120' and third height $H_3$ of insulating layer 128.

In some embodiments, insulating layer 128 is made of nitride materials, carbide materials, or oxide materials, such as silicon nitride, silicon carbide, silicon oxynitride, or aluminum oxide. In addition, other low-k dielectric materials may also be used to form insulating layer 128. Insulating layer 128 may be formed by depositing an insulating material over substrate 102 and performing a CMP process afterwards. The insulating material may be deposited by a CVD process.

Figure 2I:
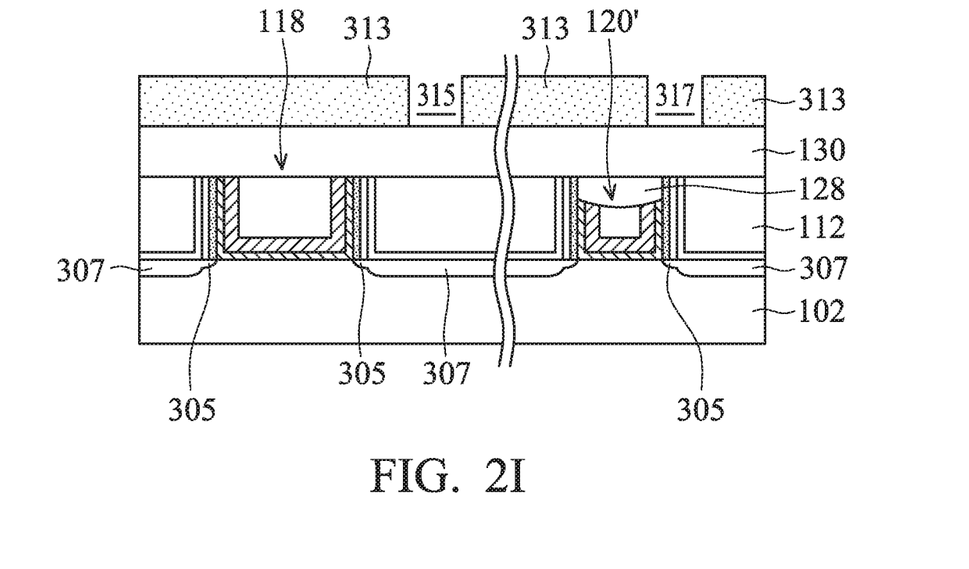

Next, a dielectric layer 130 is formed on ILD layer 112, insulating layer 128, and wide metal gate structure 118 as shown in FIG. 2I in accordance with some embodiments. In some embodiments, dielectric layer 130 is made of silicon oxide, silicon nitride, silicon oxynitride, or other applicable dielectric materials similar to, or the same as, ILD layer 112. Dielectric layer 130 may be formed by a CVD process.

Figure 2J:
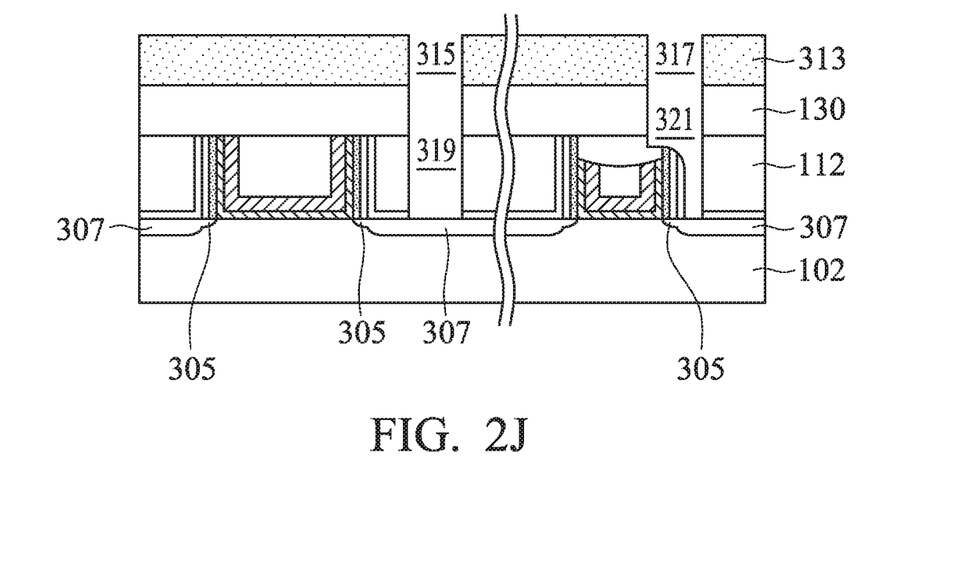

Afterwards, a photoresist layer 313 is formed over dielectric layer 130, as shown in FIG. 2I in accordance with some embodiments. Photoresist layer 313 has a first opening 315 and a second opening 317. An etching process is performed to remove the portions of ILD layer 112 and dielectric layer 130 below first opening 315 and second opening 317 of photoresist layer 313, as shown in FIG. 2J in accordance with some embodiments. A first contact trench 319 and a second contact trench 321 are therefore formed. In some embodiments, the etching process is a wet etching process. The widths of first contact trench 319 and second contact trench 321 may be adjusted as required.

Figure 2K:
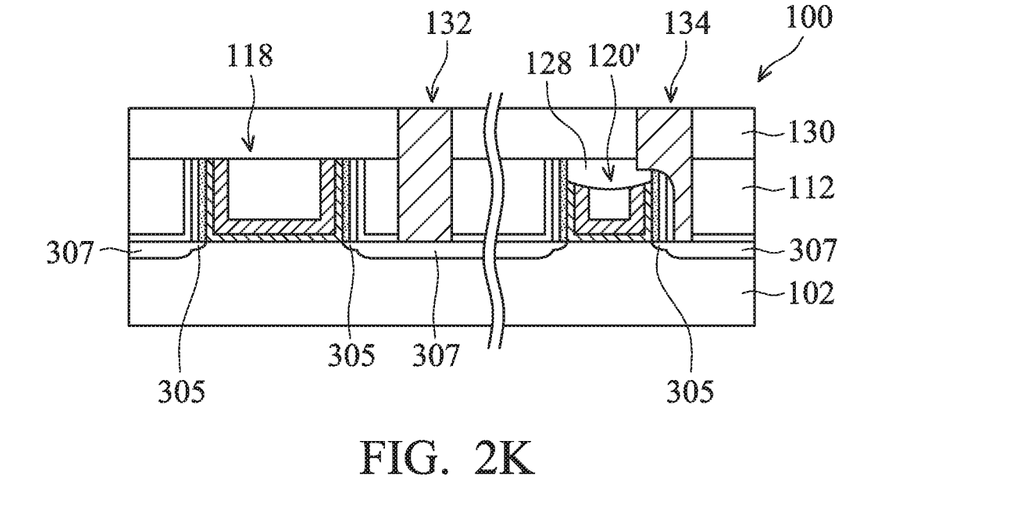

Next, first contact 132 and second contact 134 are formed in first contact trench 319 and second contact trench 321 respectively, as shown in FIG. 2K in accordance with some embodiments. In some embodiments, first contact 132 and second contact 134 are made of conductive materials such as aluminum, copper, tungsten, titanium, tantulum, titanium nitride, tantalum nitride, nickel silicide, cobalt silicide, TaC, TaSiN, TaCN, TiAl, TiAlN, other applicable conductive materials, or a combination thereof.

As shown in FIG. 2K, first contact 132 is formed over the S/D region 307 adjacent to wide metal gate structure 118, and second contact 134 is formed over the S/D region 307 adjacent to shortened narrow metal gate structure 120'. In addition, since insulating layer 128 is formed on shortened narrow metal gate structure 120' and is configured to prevent shortage between second contact 134 and shortened narrow metal gate structure 120', second contact 134 can be self-aligned to shortened narrow metal gate structure 120'. That is, insulating layer 128 can be used as a mask when second contact trench 321 is formed by the etching process, as shown in FIG. 2J. Therefore, second contact 134 formed in second contact trench 321 can be aligned to shortened narrow metal gate structure 120', while second contact 134 will not in direct contact with shortened narrow metal gate structure 120'.

As described previously, insulating layer 128 is formed on shortened narrow metal gate structure 120' to prevent shortage between second contact 134 and shortened narrow metal gate structure 120'. Therefore, second contact 134 can be a self-aligned contact aligned to shortened narrow metal gate structure 120'. In addition, since mask structure 311 is used to protect wide metal gate structure 118 during etching back process 127, conductive materials of wide metal gate structure 118 will not be damaged, and the threshold voltage remains as designed.

Figure 3:
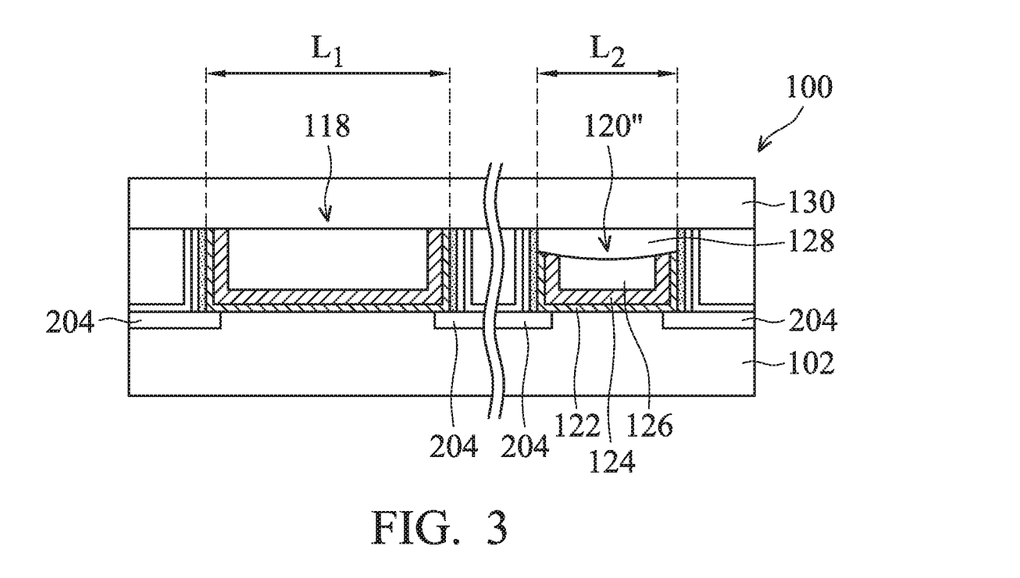
FIG. 3 illustrates a cross-section representation of the semiconductor device structure shown along line B-B' illustrated in FIG. 1 in accordance with some embodiments.

Referring back to FIG. 1, semiconductor device structure 100 further includes a third shortened metal gate structure 120" and a third contact 134' in accordance with some embodiments. FIG. 3 illustrates a cross-section representation of semiconductor device structure 100 shown along line B-B' illustrated in FIG. 1 in accordance with some embodiments. Materials and processes for forming third shortened metal gate structure 120" are similar to those for forming shortened narrow metal gate structure 120'. More specifically, third shortened metal gate structure 120" also includes gate dielectric layer 122, work function metal layer 124, and metal gate electrode layer 126. In addition, insulating layer 128 is formed on third shortened metal gate structure 120".

As shown in FIG. 1, wide metal gate structure 118 has a first length $L_1$, and third shortened metal gate structure 120" has a second length $L_2$ smaller than first length $L_1$. Since third shortened metal gate structure 120" has a relatively small length, the risks of shortage between third shortened metal gate structure 120" and third contact 134' formed adjacent to third shortened metal gate structure 120" also increase. Therefore, insulating layer 128 is also formed on third shortened metal gate structure 120" to prevent the shortage between third shortened metal gate structure 120" and third contact 134', as shown in FIG. 3 in accordance with some embodiments. In some embodiments, the materials and formation processes of third contact 134' are similar to that of second contact 134. In some embodiments, third contact 134' is a self-aligned contact.

It should be noted that wide metal gate structure 118, shortened narrow metal gate structure 120', third shortened metal gate structure 120" shown in FIG. 2 are merely examples, the scope of the disclosure is not intended to be limiting. In some embodiments, semiconductor device structure only includes two metal gate structures, such as wide metal gate structure 118 and shortened narrow metal gate structure 120'. In some embodiments, semiconductor device structure includes more than three metal gate structures.

Figure 4A:
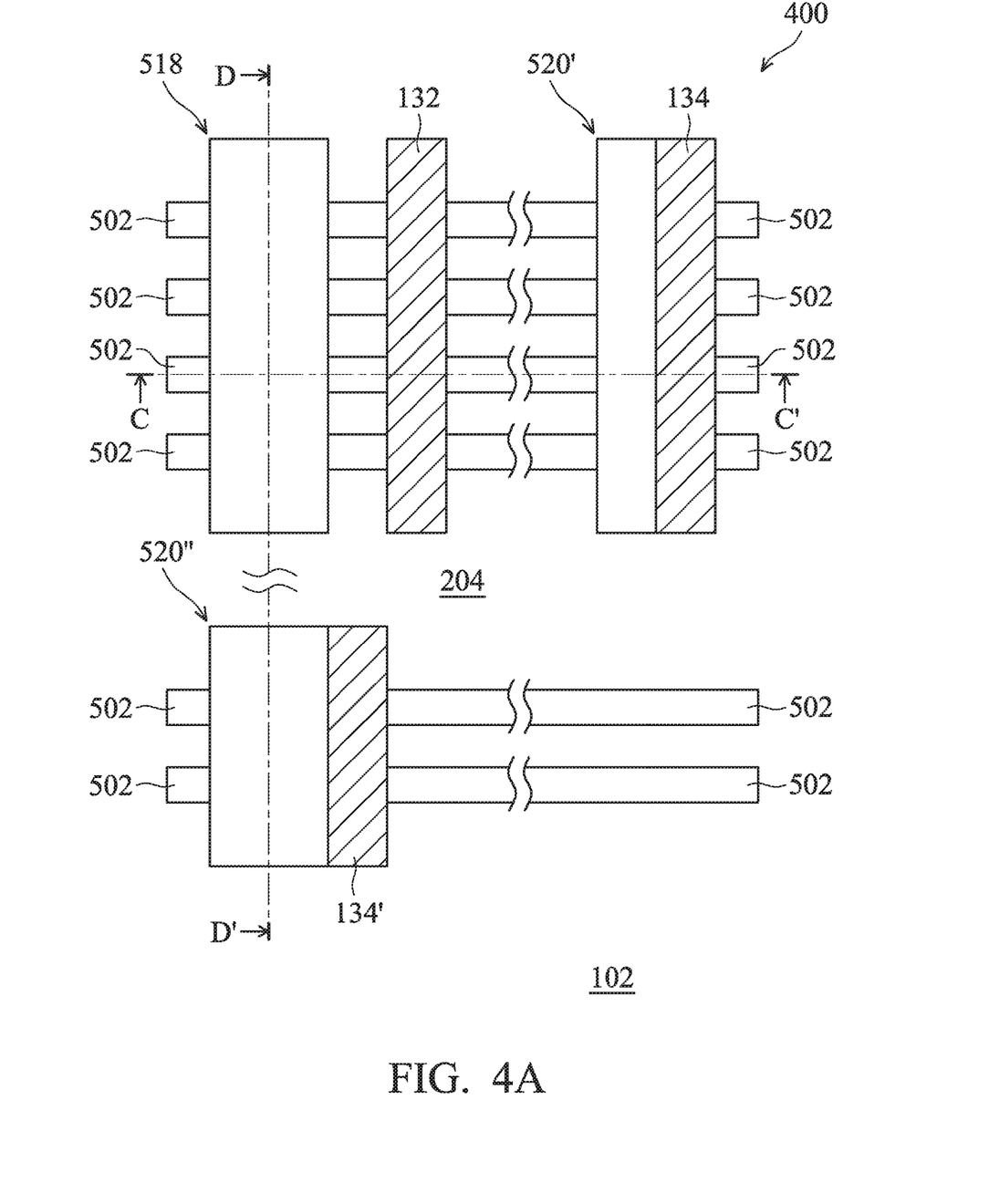
FIG. 4A illustrates a top view representation of a semiconductor device structure in accordance with some embodiments.
Figure 4B:
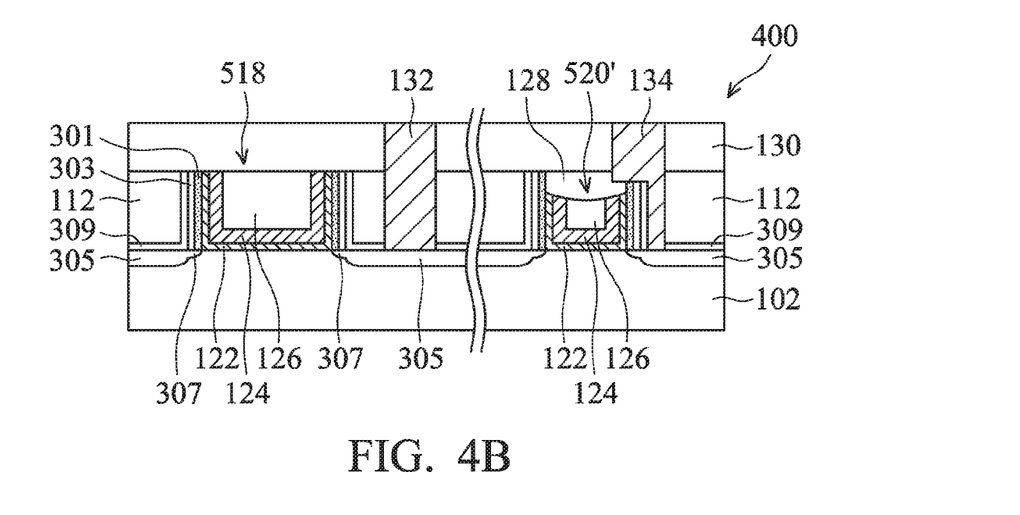
FIG. 4B illustrates a cross section representation of the semiconductor device structure shown along line C-C' illustrated in FIG. 4A in accordance with some embodiments.
Figure 4C:
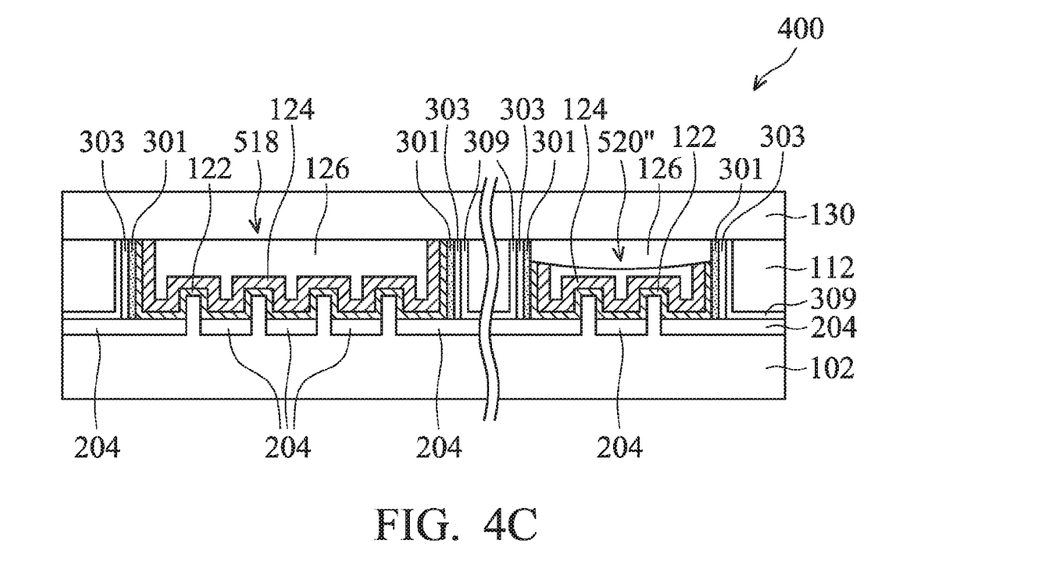
FIG. 4C illustrates a cross section representation of the semiconductor device structure shown along line D-D' illustrated in FIG. 4A in accordance with some embodiments.

In addition, the method described above, which includes the use of mask structure 311, may also be used to form a semiconductor device structure including fin field-effect transistor (FinFET) structures. FIG. 4A illustrates a top view representation of a semiconductor device structure 400 in accordance with some embodiments. FIG. 4B illustrates a cross section representation of semiconductor device structure 400 shown along line C-C' illustrated in FIG. 4A in accordance with some embodiments. FIG. 4C illustrates a cross section representation of semiconductor device structure 400 shown along line D-D' illustrated in FIG. 4A in accordance with some embodiments.

As shown in FIG. 4A, semiconductor device structure 400 includes a fourth gate structure 518, a fifth gate structure 520', and a sixth gate structure 520" formed over substrate 102. In addition, fourth gate structure 518, fifth gate structure 520', and sixth gate structure 520" are formed across fin structures 502 respectively. First contact 132 is formed adjacent to fourth gate structure 518. Second contact 134 is formed adjacent to fifth gate structure 520'. Third contact 134' is formed adjacent to sixth gate structure 520".

As shown in FIG. 4B, fourth gate structure 518 may be similar to wide metal gate structure 118, and fifth gate structure 520' may be similar to shortened narrow metal gate structure 120' in accordance with some embodiments. In some embodiments, fourth gate structure 518 and fifth gate structure 520' respectively include gate dielectric layer 122, work function metal layer 124, and metal gate electrode layer 126. In addition, insulating layer 128 is formed on fifth gate structure 520' but not on fourth gate structure 518, for fifth gate structure 520' having a relatively small width. Therefore, second contact 134 may be a self-aligned contact aligned to fifth gate structure 520'.

As shown in FIG. 4C, sixth gate structure 520" may be similar to third metal gate structure 120" in accordance with some embodiments. In some embodiments, sixth gate structure 520" includes gate dielectric layer 122, work function metal layer 124, and metal gate electrode layer 126. In addition, insulating layer 128 is formed on sixth gate structure 520" but not on fourth gate structure 518, for sixth gate structure 520" having a relatively small width. Therefore, third contact 134' may be a self-aligned contact aligned to sixth gate structure 520".

As shown in FIGS. 4B and 4C, semiconductor device structure 400 also includes sealing layer 301, spacers 303, LDD regions 305, S/D regions 307, CESL 309, ILD layer 112, and dielectric layer 130 in accordance with some embodiments. These elements may be similar to, or the same as those described previously, and detailed descriptions of these elements are not repeated herein.

As described previously, the semiconductor device structures, such as semiconductor device structure 100, include the gate structures having various channel lengths in accordance with some embodiments. For example, semiconductor device structure 100 includes wide metal gate structure 118 and shortened narrow metal gate structure 120', and width $W_1$ of wide metal gate structure 118 is larger than width $W_2$ of shortened narrow metal gate structure 120'. However, the difference between width $W_1$ and width $W_2$ will result in different etching rate dues to the loading effect. Therefore, mask structure 311 is used to protect wide metal gate structure 118 during etching back process 127. As a result, the top portion of wide metal gate structure 118 is not removed during etching back process 127, while the top portion of narrow metal gate structure 120 is removed to form shortened narrow metal gate structure 120'.

Accordingly, damage to wide metal gate structure 118 resulting from the loading effect during etching back process 127 is prevented, and the threshold voltage of wide metal gate structure 118 remains as designed.

In addition, insulating layer 128 is formed on shortened narrow metal gate structure 120' to prevent shortage between shortened narrow metal gate structure 120' and contact 134. Therefore, contact 134 may be a self-aligned contact in accordance with some embodiments. Furthermore, a portion of contact 134 may be formed on insulating layer 128 and is separated from shortened narrow metal gate structure 120' by insulating layer 128.

Embodiments of a semiconductor device structure are provided. The semiconductor device structure includes a first metal gate structure and a second metal gate structure. An insulating layer is formed on the second metal gate structure. The first metal gate structure has a first width, and the second metal gate structure has a second width smaller than the first width. The second metal gate structure is shortened by an etching back process. In addition, during the etching back process, a mask structure is formed on the first metal gate structure, such that the first metal gate structure is protected by the mask structure. Therefore, the first metal gate structure is not damaged by the etching back process, and the threshold voltage of the first metal gate structure remains as designed.

In some embodiments, a semiconductor device structure is provided. The semiconductor device structure includes a substrate and a first metal gate structure formed over the substrate. The first metal gate structure has a first width. The semiconductor device structure further includes a first contact formed adjacent to the first metal gate structure and a second metal gate structure formed over the substrate. The second metal gate structure has a second width smaller than the first width. The semiconductor device structure further includes an insulating layer formed over the second metal gate structure and a second contact self-aligned to the second metal gate structure.

In some embodiments, a semiconductor device structure is provided. The semiconductor device structure includes a substrate and a first metal gate structure formed over the substrate. The semiconductor device structure further includes a first contact formed adjacent to the first metal gate structure and a second metal gate structure formed over the substrate. The semiconductor device structure further includes an insulating layer formed over the second metal gate structure and a second contact self-aligned to the second metal gate structure. In addition, the first metal gate structure has a first width and a first height, and the second metal gate structure has a second width and a second height smaller than the first height, and a ratio of the first width to the second width is in a range from about 2 to about 15.

In some embodiments, a method for forming a semiconductor device structure is provided. The method includes forming a first metal gate structure and a second metal gate structure in an inter-layer dielectric (ILD) layer over a substrate. The method further includes forming a mask structure on the first metal gate structure and exposing a top surface of the second metal gate structure. The method further includes etching a top portion of the second metal gate structure to shorten the second metal gate structure. The method further includes forming an insulating layer on the second metal gate structure. The method further includes forming a first contact adjacent to the first metal gate structure and a second contact self-aligned to the second metal gate structure. In addition, the first metal gate structure has a first width and the second metal gate structure has a second width smaller than the first width.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor device structure, comprising:

forming a first metal gate structure and a second metal gate structure in an inter-layer dielectric (ILD) layer over a substrate;

forming a mask structure on the first metal gate structure and exposing a top surface of the second metal gate structure;
etching a top portion of the second metal gate structure to shorten the second metal gate structure;
forming an insulating layer on the second metal gate structure; and
forming a first contact adjacent to the first metal gate structure and a second contact self-aligned to the second metal gate structure,
wherein the first metal gate structure has a first width and the second metal gate structure has a second width smaller than the first width.

2. The method for forming a semiconductor device structure as claimed in claim 1, further comprising:
removing the mask structure before insulating layer is formed on the second metal gate structure.

3. The method for forming a semiconductor device structure as claimed in claim 1, wherein a portion of the second contact is formed on the insulating layer and is separated from the second metal gate structure by the insulating layer.

4. The method for forming a semiconductor device structure as claimed in claim 1, wherein the mask structure comprises a photoresist layer and a bottom anti-reflective coating layer.

5. The method for forming a semiconductor device structure as claimed in claim 1, wherein forming the first contact and the second contact further comprises:
forming a dielectric layer over the substrate to cover the ILD layer, the first metal gate structure, and the second metal gate structure;
forming a photoresist layer over the dielectric layer, wherein the photoresist layer has a first opening and a second opening;
performing an etching process through the first opening and the second opening to form a first contact trench and a second contact trench; and
filling the first contact trench and the second contact trench with a conductive material to form the first contact and the second contact.

6. The method for forming a semiconductor device structure as claimed in claim 1, wherein the insulating layer is formed on the second metal gate structure but not on the first metal gate structure.

7. The method for forming a semiconductor device structure as claimed in claim 1, wherein a ratio of the first width to the second width is in a range from about 2 to about 15.

8. The method for forming a semiconductor device structure as claimed in claim 1, wherein a height of the first metal gate structure is substantially equal to a sum of a height of the second metal gate structure and a height of the insulating layer.

9. A method for forming a semiconductor device structure, comprising:
forming a first metal gate structure having a first metal gate electrode with a first width;
forming a second metal gate structure having a second metal gate electrode with a second width different than the first width;
etching a top portion of the second metal gate structure to provide the second metal gate structure having a height less than the first metal gate structure after the etching;
depositing a first insulating layer on the second metal gate structure after the etching;
depositing a second insulating layer over the first insulating layer and the first metal gate electrode; and
forming a plurality of contact holes in the second insulating layer, wherein at least one contact hole extends into the first insulating layer.

10. The method of claim 9, further comprising:
forming a wide dummy gate structure and a narrow dummy gate structure over the substrate;
forming an interlayer dielectric (ILD) layer over the wide and narrow dummy gate structures;
planarizing the ILD layer until top surfaces of the wide and narrow dummy gate structures are exposed;
removing the wide dummy gate structure to form a first trench and removing the narrow dummy gate structure to form a second trench, wherein the first metal gate structure is formed in the first trench and the second metal gate structure is formed in the second trench.

11. The method of claim 9, wherein the etching the top portion of the second metal gate structure includes removing portions of a work function metal layer of the second metal gate structure.

12. The method of claim 11, wherein the etching the top portion of the second metal gate structure further includes removing portions of the second metal gate electrode disposed over the work function metal layer.

13. The method of claim 12, wherein the etching the top portion of the second metal gate structure further includes removing portions of a gate dielectric layer of the second metal gate structure.

14. The method of claim 9, wherein during the etching the top portion of the second metal gate structure, a mask structure is disposed over the first metal gate structure.

15. The method of claim 14, further comprising:
removing the mask structure before depositing the first insulating layer on the second metal gate structure; and
removing a portion of the first insulating layer over the first metal gate structure prior to depositing the second insulating layer.

16. A method for forming a semiconductor device structure, comprising:
providing a first gate structure and a second gate structure in an inter-layer dielectric (ILD) layer over a substrate;
forming a mask structure on the first gate structure and exposing a top surface of the second gate structure;
while the mask structure is disposed on the first gate structure, etching a top portion of the second gate structure to provide a recess over the second gate structure and laterally coplanar with the ILD layer;
depositing an insulating layer in the recess while the mask structure is disposed on the first gate structure;
removing the mask structure; and
after the removing, depositing a dielectric layer over the insulating layer and the first gate structure.

17. The method of claim 16, wherein the forming the mask structure includes depositing a photoresist layer and a bottom anti-reflective coating (BARC) layer.

18. The method of claim 16, further comprising:
forming a first contact extending to a first source/drain region adjacent the first gate structure; and
forming a second contact extending to a second source/drain region adjacent the second gate structure.

19. The method of claim 18, wherein the second contact extends into the insulating layer.

20. The method of claim 19, wherein the second contact does not extend into the second gate structure.

* * * * *